United States Patent [19]

Kato et al.

[11] Patent Number: 4,905,314

[45] Date of Patent: Feb. 27, 1990

[54] SEMICONDUCTOR INTEGRATED CIRCUIT DEVICE HAVING AN OBJECT CIRCUIT TO WHICH OUTPUT VOLTAGES OF THE SUB- AND MAIN BOOSTER CIRCUITS ARE APPLIED

[75] Inventors: Hideo Kato, Kawasaki; Hiroshi Iwahashi, Yokohama; Masamichi Asano, Tokyo; Akira Narita, Kawasaki; Shinichi Kikuchi, Yokohama, all of Japan

[73] Assignee: Kabushiki Kaisha Toshiba, Kawasaki, Japan

[21] Appl. No.: 184,580

[22] Filed: Apr. 21, 1988

[30] Foreign Application Priority Data

Apr. 24, 1987 [JP] Japan .................. 62-101419

[51] Int. Cl.⁴ ..................... H03K 17/10; H03K 3/57
[52] U.S. Cl. .................. 307/264; 307/578; 307/482
[58] Field of Search .......... 307/443, 446, 450, 451, 307/482, 578, 264, 475; 365/226, 228, 203, 204

[56] References Cited

U.S. PATENT DOCUMENTS

| | | | |
|---|---|---|---|
| 4,382,194 | 5/1983 | Nakano et al. | 307/482 |
| 4,398,100 | 8/1983 | Tobita et al. | 307/482 |
| 4,511,811 | 4/1985 | Gupta | 307/578 |
| 4,550,264 | 10/1985 | Takahaski et al. | 307/482 |
| 4,689,495 | 8/1987 | Liu | 307/482 |
| 4,716,303 | 12/1987 | Mimoto | 307/482 |
| 4,725,746 | 2/1988 | Segawa et al. | 307/482 |
| 4,731,552 | 3/1988 | Miyamoto | 307/482 |

OTHER PUBLICATIONS

Japanese Patent Disclosure (Kokai) No. 62-62497, Yasutaka (Mar. 19, 1987).

Yatsuda et al., "Hi-MNOS II Technology for a 64-kbit Byte-Erasable 5-V-Only EEPROM," IEEE Journal of Solid-State Circuits, vol. SC-20, No. 1, pp. 144-151, Feb. 1985.

Primary Examiner—Stanley D. Miller
Assistant Examiner—Timothy P. Callahan
Attorney, Agent, or Firm—Finnegan, Henderson, Farabow, Garrett and Dunner

[57] ABSTRACT

A sub-booster circuit for further stepping up an output voltage of a main booster circuit includes a first MOS transistor having a drain connected to the output terminal of the main booster circuit, and a gate connected to an input terminal of an object circuit, a second MOS transistor having a drain and a gate connected to the source of the first MOS transistor and a source connected to the input terminal of the object circuit, and a MOS capacitor having a first electrode connected to a connection node between the first and second MOS transistors and a second electrode connected to receive a clock pulse signal. A threshold voltage of the second MOS transistor is set to be larger in its absolute value than a threshold voltage of the first MOS transistor and the MOS capacitor has substantially the same threshold voltage as that of the second MOS transistor.

3 Claims, 2 Drawing Sheets

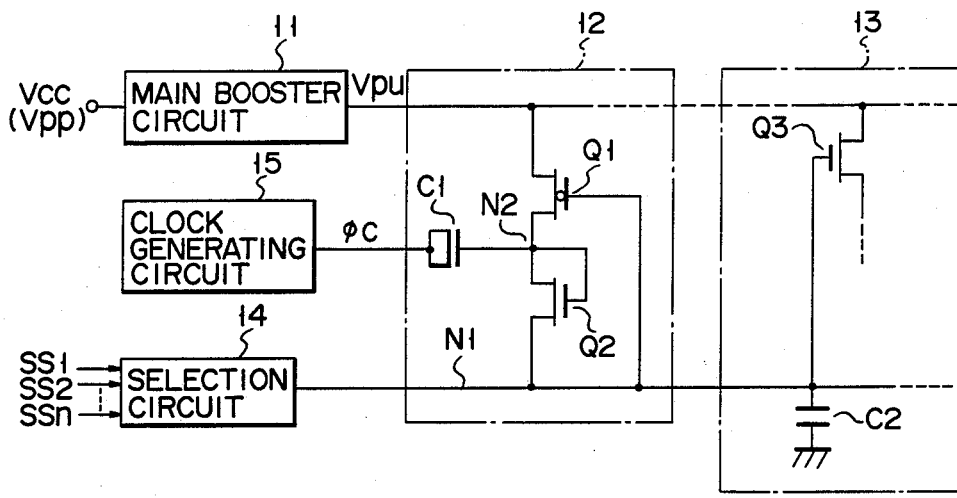
F I G. 1
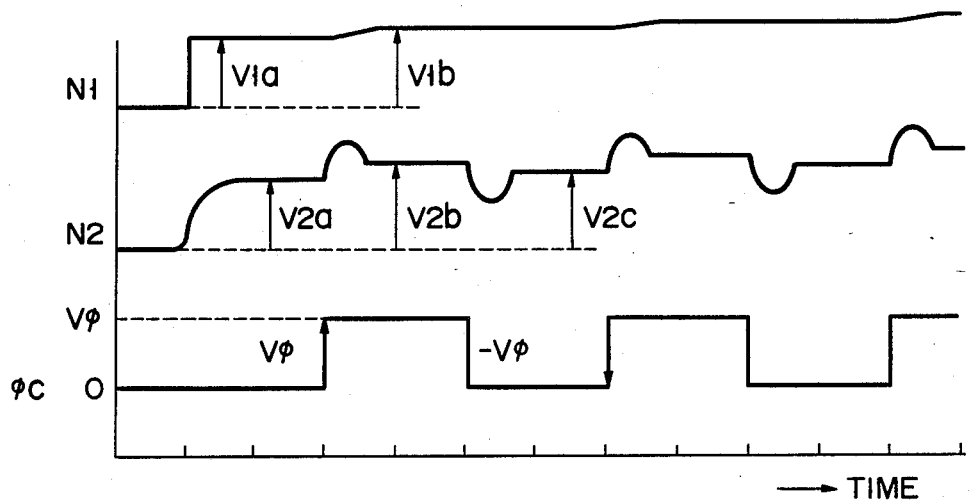
F I G. 2

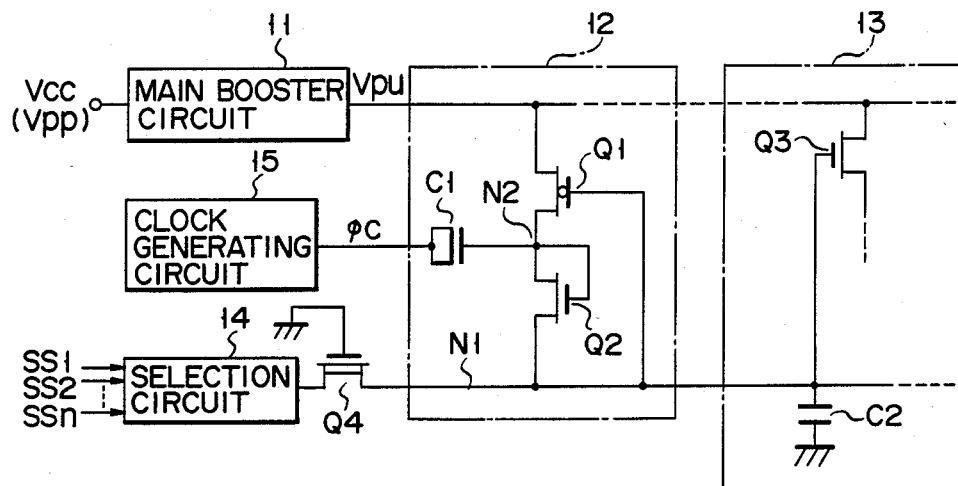
F I G. 3
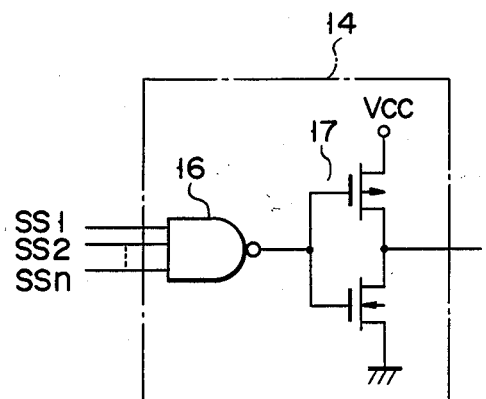
F I G. 4

SEMICONDUCTOR INTEGRATED CIRCUIT DEVICE HAVING AN OBJECT CIRCUIT TO WHICH OUTPUT VOLTAGES OF THE SUB- AND MAIN BOOSTER CIRCUITS ARE APPLIED

BACKGROUND OF THE INVENTION

1. Field of the Invention

This invention relates to a MOS semiconductor integrated circuit, and more particularly to a sub-booster circuit for raising an output voltage of a main booster circuit which generates a voltage higher than a power source voltage.

2. Description of the Related Art

In recent years, floating gate type nonvolatile semiconductor memories called EPROM and EEPROM have rapidly spread. Data can be electrically written into the EPROM and erased by application of ultraviolet rays. In the EEPROM, data can be written and erased electrically. This type of semiconductor memory includes, for example, a memory which utilizes the Fowler-Nordheim tunneling effect. In the memory utilizing the tunneling effect, electrons are injected into or discharged from the floating gate via the thin oxide film in the data write-in or erasing operation. In the data write-in or erasing operation, there is little current consumption. Therefore, the data write-in or erasing operation can be effected by using an output voltage of a booster circuit provided in the memory instead of externally applying a high voltage required for the data write-in or erasing operation. Thus, even if the booster circuit has a low current supplying ability, it can be used without any serious problem.

Recently, the circuit scale of the nonvolatile memory becomes large and the number of peripheral circuits (load circuits) to be supplied with a stepped-up voltage increases. Therefore, the load capacitance of the booster circuit increases, thereby making it necessary to take a long step-up time for raising an output voltage to a desired level. In the semiconductor integrated circuit, the load circuits to be supplied with an output voltage of the booster circuit are divided into a plurality of blocks and transfer gates are connected to input terminals of the respective blocks. The transfer gates are selectively activated by a control signal for selecting one of the blocks. An output voltage of the booster circuit is supplied to the load circuit block via the selected transfer gate. Thus, the load capacitance of the booster circuit is lowered, preventing the voltage step-up time from being increased.

As described above, in the case where the load circuits are divided into a plurality of blocks, it is necessary to apply a voltage higher than an output voltage of the booster circuit to the gate of the transfer gate. In other words, it is necessary to set the control signal for controlling the transfer gate higher than the output voltage of the booster circuit. This is because the voltage supplied to the load circuit block is lowered by the threshold voltage of the transfer gate. For this reason, a sub-booster circuit is used in addition to a main booster circuit in order to further raise a voltage which has been stepped up by the main booster circuit. An output voltage of the sub-booster circuit is higher than the output voltage of the main booster circuit by more than the threshold voltage of the transfer gate. The output voltage of the sub-booster circuit is supplied to the transfer gates to selectively activate the transfer gate. Since the transfer gate is selectively activated by a high voltage (equal to or higher than the sum of an output voltage of the main booster circuit and the threshold voltage of the transfer gate) of the sub-booster circuit, a voltage supplied from the booster circuit to the load circuit block will not be lowered by the threshold voltage of the transfer gate. Therefore, the output voltage of the booster circuit is efficiently supplied to the selected load circuit block.

With the use of the sub-booster circuit, the load capacitance of the main booster circuit can be lowered, thereby permitting a stepped-up voltage to be supplied to the load circuit in a brief time without lowering the output voltage of the main booster circuit. In this way, a high voltage used for writing or erasing data in a semiconductor memory can be generated in the semiconductor integrated circuit (such as a nonvolatile semiconductor memory).

Further, in a MOS semiconductor integrated circuit, a MOS transistor is used in the input stage of the load circuit, and a stepped-up voltage is applied to the gate of the MOS transistor. Therefore, a voltage supplied to the internal circuit of the load circuit is lowered by the threshold voltage of the input stage MOS transistor. For this reason, it is preferable to further raise an output voltage of the main booster circuit by means of the sub-booster circuit and supply it to the gate of the input stage MOS transistor even when the load circuits are not divided into a plurality of blocks.

For the reasons described above, it is required to use a highly efficient sub-booster circuit. However, the voltage step-up efficiency of the sub-booster circuit which is commonly used is not sufficiently high to further raise the output voltage of the main booster circuit, and therefore it is strongly required to develop the sub-booster circuit.

SUMMARY OF THE INVENTION

An object of this invention is to provide a sub-booster circuit capable of raising an output voltage of a main booster circuit at a high efficiency.

This object can be attained by a sub-booster circuit comprising a first switching circuit which is connected at one end to receive an output voltage of a main booster circuit and has a control input terminal connected to an input terminal of an object circuit to be supplied with a stepped-up voltage; a second switching circuit having one end and a control terminal connected to the other end of the first switching circuit and the other end connected to the input terminal of the object circuit, a potential for turning on the second switching circuit being larger in its absolute value than a potential for turning on the first switching circuit; and a capacitance circuit having a first electrode connected to a connection node between the first and second switching circuits and a second electrode connected to receive a clock pulse signal, the capacitance circuit functioning as a capacitor when a potential at the first electrode is substantially equal to or higher than the potential for turning on the second switching circuit and exhibiting no capacitance property when the potential at the first electrode is lower than the potential for turning on the second switching circuit.

With this construction, ON-resistances of the first and second switching circuits can be set to a small value and the second switching circuit can be kept in the off condition when the clock pulse falls. Therefore, a sub-booster circuit is provided in which reduction in the output voltage caused by the presence of the first and second switching circuits may be suppressed to a minimum and which is operated to raise a voltage at a high step-up efficiency and high reliability.

BRIEF DESCRIPTION OF THE DRAWINGS

FIG. 1 is a circuit diagram showing a sub-booster circuit according to a first embodiment of this invention;

FIG. 2 is a timing chart for illustrating the operation of a circuit shown in FIG. 1;

FIG. 3 is a circuit diagram showing a sub-booster circuit according to a second embodiment of this invention; and FIG. 4 is a circuit diagram showing the construction of a selection circuit used in the circuit shown in FIG. 3.

DETAILED DESCRIPTION OF THE PREFERRED EMBODIMENTS

FIG. 1 shows a sub-booster circuit according to one embodiment of this invention and the peripheral circuits thereof. Power source voltage Vcc (or externally supplied high voltage Vpp) is stepped up or boosted by means of main booster circuit 11. Stepped-up voltage Vpu which is obtained by raising power source voltage Vcc or high voltage Vpp by using main booster circuit 11 is supplied to sub-booster circuit 12 and object circuit 13 which is operated by the stepped-up voltage. Sub-booster circuit 12 includes N-channel MOS transistors Q1 and Q2 and MOS capacitor C1. The drain of MOS transistor Q1 is connected to the output terminal of main booster circuit 11, and the gate thereof is connected to the output terminal (node N1) of selection circuit 14. The input terminal of selection circuit 14 is connected to receive selection signals SS1 to SSn for selecting sub-booster circuit 12. Further, the output terminal of selection circuit 14 is connected to the input terminal of object circuit 13. The source of MOS transistor Q1 is connected to the drain and gate of MOS transistor Q2 and the source of MOS transistor Q2 is connected to node N1. A connection node (node N2) between the source of MOS transistor Q1 and the drain of MOS transistor Q2 is connected to a first electrode of MOS capacitor C1. A second electrode of MOS capacitor C1 is connected to the output terminal of clock generation circuit 15 so as to receive clock pulse $\phi c$.

Object circuit 13 includes N-channel MOS transistor Q3. The drain of MOS transistor Q3 is connected to the output terminal of main booster circuit 11 and the gate thereof is connected to node N1. Further, the source of MOS transistor Q3 is connected to an internal circuit which is not shown. In FIG. 1, a parasitic capacitor such as a wiring capacitor and a gate capacitor is denoted by capacitor C2 which is grounded at one electrode.

There will now be described the operation of the circuit with the construction described above with reference to the timing chart shown in FIG. 2. When an output signal on the output terminal (node N1) of selection circuit 14 is set to a "1" level, sub-booster circuit 12 is selected, turning on MOS transistor Q1. As a result of this, potential V2a at node N2 is raised to a potential level which is lower than potential V1a at node N1 by threshold voltage $V_{TH1}$ of N-channel MOS transistor Q1. An increase in potential V2a at node N2 renders MOS transistor Q1 nonconductive. Therefore, potential V2a at node N2 set at this time is given as follows:

$$V2a = V1a - V_{TH1} \qquad (1)$$

When potential V2a at node N2 is higher than threshold voltage $V_{THC}$ of MOS capacitor C1, an inverted layer is formed under the gate of MOS capacitor C1, thus providing a coupling capacitor between the output terminal of clock generation circuit 15 and node N2. Assume now that the input voltage level of the clock pulse is $V\phi$. Then, charge E1a expressed by the following equation (2) is stored in MOS capacitor C1:

$$E1a = C1 \times (V2a - V\phi) \qquad (2)$$

At this time, if the level of clock pulse $\phi c$ is 0 V, charge E1a stored in MOS capacitor C1 is expressed as follows:

$$E1a = C1 \times V2a = C1 \times (V1a - V_{TH1}) \qquad (3)$$

In this case, if clock pulse $\phi c$ with potential $V\phi$ rises, a potential at node N2 is raised as a result of the capacitive coupling of capacitor C1. When the potential at node N2 becomes higher than a voltage obtained by adding threshold voltage $V_{TH2}$ of N-channel MOS transistor Q2 to potential V1a at node N1, MOS transistor Q2 is turned on, causing the charge stored in capacitor C1 to be discharged to node N1 via MOS transistor Q2. Due to the discharge operation, the potential at node N1 rises. Since, in this case, MOS transistor Q2 is turned off again by a voltage obtained by adding threshold voltage $V_{TH2}$ of MOS transistor Q2 to the potential at node N1, the potential at node N2 is kept at the potential level which is set up at this time. Therefore, potential V2b at node N2 is expressed as follows:

$$V2b = V1b + V_{TH2} \qquad (4)$$

V1b denotes a potential at node N1 after the rise potential has been reached.

Therefore, charge E1b remaining in capacitor C1 can be expressed as follows:

$$E1b = C1 \times (V2b - V\phi) = C1 \times (V1b + V_{TH2} - V\phi) \qquad (5)$$

Further, initial charge E2a in load capacitor C2 at node N1 is expressed as follows:

$$E2b = C2 \times V1b \qquad (6)$$

Therefore, charge E2b stored in load capacitor C2 after the potential of the rise at node N1 has been reached can be expressed as follows:

$$E2b = C2 \times V1b \qquad (7)$$

Since, at this time, total amount E of the charges stored in MOS capacitor C1 and load capacitor C2 is kept constant before and after the rise of clock pulse $\phi c$, it can be expressed as follows:

$$E = E1a + E2a = E1b + E2b \qquad (8)$$

Therefore, the following equation can be obtained:

$$\{C1 \times (V1a - V_{TH})\} + (C2 \times V1a) = \{C1 \times (V1b + V_{TH2} - V\phi)\} + (C2 \times V1b) \qquad (9)$$

From equation (9), potential V1b at node N1 after the potential of the rise has been reached can be obtained as follows:

$$V1b = V1a + (V\phi - V_{TH1} - V_{TH2}) \times C1/(C1 + C2) \qquad (10)$$

Thus, potential V1a at node N1 rises by

"$(V\phi - V_{TH1} - V_{TH2}) \times C1/(C1+C2)$".

Next, when clock pulse $\phi c$ falls with potential $-V\phi$, the potential at node N2 starts to fall due to the capacitive coupling of MOS capacitor C1. However, when a potential at node N2 becomes lower than a voltage "$V2c = V1b - V_{TH1}$", that is, a voltage which is lower than the gate voltage of MOS transistor Q1 or voltage V1b at node N1 by threshold voltage $V_{TH1}$ of MOS transistor Q1, MOS transistor Q1 is turned on, thus restarting the charging of node N2. Therefore, the potential at node N2 rises to a potential of "$V2c = V1b - V_{TH1}$" which may cause MOS transistor Q1 to be turned off. At this time, since gate voltage V2c of MOS transistor Q2 is lowered and MOS transistor Q2 is kept in the OFF condition, potential V1b at node N1 is kept constant.

From the above description, it is clearly understood that potential V1 at node N1 is raised by an amount determined by "$(V\phi - V_{TH1} - V_{TH2}) \times C1/(C1+C2)$" each time clock pulse $\phi c$ rises. Therefore, in order to most efficiently operate sub-booster circuit 12, care should be taken to satisfy the following conditions (a) to (d).

(a) The rise time of clock pulse $\phi c$ should be set to be short.

(b) The value of load capacitor C2 should be set to be small or coupling MOS capacitor C1 should be set to have a capacitance relatively larger than load capacitor C2 to make "$C1/(C1+C2)$" as close to "1" as possible.

(c) Input voltage level $V\phi$ of clock pulse $\phi c$ should be set to be high.

(d) Threshold voltages $V_{TH1}$ and $V_{TH2}$ of MOS transistors Q1 and Q2 should be set to be low.

However, in the MOS semiconductor integrated circuit, conditions (a) to (c) are determined by other factors and it is frequently impossible to satisfy these conditions. In order to satisfy condition (d), it is necessary to keep MOS transistor Q2 in the nonconductive state at the time clock pulse $\phi c$ falls. The cutoff condition of MOS transistor Q2 can be expressed as follows:

$$V_{GS2} - V_{TH2} < 0 \qquad (11)$$

$V_{GS2}$ denotes a potential difference between the gate and source of MOS transistor Q2.

Since gate voltage $V_G$ of MOS transistor Q2 is "$V1a - V_{TH1}$" and source voltage $V_S$ is "$V1a$", expression (11) can be rewritten as follows:

$$V1a - V_{TH1} - V1a - V_{TH2} = -V_{TH1} - V_{TH2} < 0 \qquad (12)$$

Since $V_{TH2}$ is positive, the following expression can be obtained;

$$|V_{TH1}| < V_{TH2} \qquad (13)$$

That is, a booster circuit having a high step-up efficiency can be obtained by satisfying the condition on the threshold voltage. Further, if condition (d) is satisfied, a booster circuit capable of supplying a high stepped-up voltage can be designed while the reduction of the output voltage due to the threshold voltage of MOS transistors Q1 and Q2 can be suppressed to a minimum. In the first embodiment, this is achieved by using an intrinsic MOS transistor having a threshold voltage of substantially 0 V as MOS transistor Q1 and using an enhancement type MOS transistor having a positive threshold voltage as MOS transistor Q2.

FIG. 3 shows a sub-booster circuit according to a second embodiment of this invention and peripheral circuits thereof. Portions in FIG. 3 which correspond to those in FIG. 1 are denoted by the same reference numerals and the explanations thereof are therefore omitted. Depletion type N-channel MOS transistor Q4 having a gate grounded is connected between the output terminal of selection circuit 14 and node N1 of sub-booster circuit 12. For example, as shown in FIG. 4, selection circuit 14 includes NAND gate (or NOR gate) 16 and CMOS inverter 17. Input terminals of NAND gate 16 are connected to receive selection signals SS1 to SSn (which can be replaced by address signals in the case of memory) which are used to select sub-booster circuit 12. When sub-booster circuit 12 is selected, an output potential of CMOS inverter 17 is set to a Vcc level (for example, 5 V), and when sub-booster circuit 12 is not selected, the output potential is set to 0 V.

MOS transistor Q4 is turned off when a potential at node N1 is stepped up, thus preventing the charge from being discharged from node N1. Further, when sub-booster circuit 12 is selected, the potential at node N1 is set to a potential level of ($-V_{TH4}$) obtained by subtracting threshold voltage $V_{TH4}$ of MOS transistor Q4 from the gate voltage of MOS transistor Q4. When the potential at node N1 is set to ($-V_{TH4}$), MOS transistor Q1 is turned on. Therefore, the potential appearing at node N2 at this time can be expressed as follows, based on equation (1) ("$V2a = V1a - V_{TH1}$"):

$$V2a = -V_{TH4} - V_{TH1} \qquad (14)$$

In order to attain the voltage step-up operation by means of sub-booster circuit 12, it is necessary to set the potential at node N2 higher than threshold voltage $V_{THC}$ of MOS capacitor C1 so as to form an inversion layer under the gate, thus forming a coupling capacitor. For this reason, it is required that potential V2a at node N2 be set higher than threshold voltage $V_{THC}$ of MOS capacitor C1 at the time circuit 12 is selected. Since $V2a > V_{TH1}$, the following expression can be obtained:

$$-V_{TH4} - V_{TH1} > V_{THC} \qquad (15)$$

As is clearly seen from equation (15), if threshold voltage $V_{TH1}$ of MOS transistor Q1 is set as low as possible, the condition set by expression (15) can be more easily satisfied, and consequently a large tolerance for variation in the threshold voltages occurring in the manufacturing process of MOS semiconductor integrated circuits can be attained.

In the circuit of FIG. 3, MOS capacitor C1 is formed to have the same structure as enhancement type MOS transistor Q2 so as to have threshold voltage $V_{THC}$ of 1 V, for example, MOS transistor Q1 is formed to have threshold voltage $V_{TH1}$ of 0 V, and MOS transistor Q4 is formed in the same manner as a depletion type so as to have threshold voltage $V_{TH4}$ of $-3$ V, for example.

As described before, it is only required that the circuit of this invention satisfy the condition set by the expression "$|V_{TH1}| < V_{TH2}$". Therefore, when $V_{TH2}$ is set to 1 V, the most efficient step-up operation can be attained by setting $V_{TH1}$ to $-0.9$ V. Since the threshold voltage of MOS capacitor C1 is set to be equal to that of MOS transistor Q2, V2 is set to 0.9 V when sub-booster circuit 12 is not selected, that is, at the time of V1=0 V.

Therefore, in this case, no inversion layer is formed in MOS capacitor C1, and MOS capacitor can be substantially neglected. At this time, even if clock pulse $\phi c$ has varied in level, the potential at node N2 will not change.

As described above, according to this invention, a sub-booster circuit which can step up an output voltage of a main booster circuit with a high step-up efficiency can be provided.

What is claimed is:

1. A semiconductor integrated circuit device comprising:
    main booster means for stepping up a power source voltage;
    sub-booster means for stepping up an output voltage of said main booster means;
    an object circuit to which the output voltages of said main booster means and said sub-booster means are applied, said object circuit including an input stage MOS transistor whose one end is connected to an output terminal of said main booster means and whose gate is connected to an output terminal of said sub-booster means,
    said sub-booster means and said object circuit being adapted to apply through another end of said input stage MOS transistor the output voltage of said main booster means not reduced by the threshold voltage of said input stage MOS transistor; and
    selection means for selectively applying the output voltage of said main booster means to said object circuit by selectively driving said sub-booster means when a plurality of selection signals are applied to said selection means.

2. A semiconductor integrated circuit device according to claim 1, wherein said sub-booster means includes a first MOS transistor whose drain is connected to the output terminal of said main booster means and whose gate is connected to the gate of said input stage MOS transistor, a second MOS transistor whose drain and gate are connected to the source of said first MOS transistor and whose source is connected to the gate of said input stage MOS transistor, and a MOS capacitor whose one electrode is connected to a connection of said first and second MOS transistors and whose other electrode is supplied with a clock pulse, the threshold voltage of said second MOS transistor being higher than the absolute value of the threshold voltage of said first MOS transistor and the threshold voltage of said MOS capacitor being substantially the same as the threshold voltage of said second MOS transistor.

3. A semiconductor integrated circuit device according to claim 1, further comprising a depletion type MOS transistor whose one end is connected to the output terminal of said sub-booster means and whose gate is grounded, and selection means for selectively applying an output voltage of said main booster means to said object circuit by selectively driving said sub-booster means when a plurality of decoded selection signals is supplied to one end of said depletion type MOS transistor.

* * * * *